(12) United States Patent
Breitwisch et al.

(10) Patent No.: US 8,278,197 B2
(45) Date of Patent: Oct. 2, 2012

(54) METHOD TO TAILOR LOCATION OF PEAK ELECTRIC FIELD DIRECTLY UNDERNEATH AN EXTENSION SPACER FOR ENHANCED PROGRAMMABILITY OF A PROMPT-SHIFT DEVICE

(75) Inventors: Matthew J. Breitwisch, Yorktown Heights, NY (US); Roger W. Cheek, Somers, NY (US); Jeffrey B. Johnson, Essex Junction, VT (US); Chung H. Lam, Peekskill, NY (US); Beth A. Rainey, Williston, VT (US); Michael J. Zierak, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 901 days.

(21) Appl. No.: 12/130,460

(22) Filed: May 30, 2008

(65) Prior Publication Data

US 2009/0294850 A1 Dec. 3, 2009

(51) Int. Cl.
*H01L 21/265* (2006.01)
(52) U.S. Cl. ......... 438/519; 438/510; 438/514; 438/527
(58) Field of Classification Search .................. 438/510, 438/514, 519, 527
See application file for complete search history.

(56) References Cited

U.S. PATENT DOCUMENTS

| 6,518,614 | B1 | 2/2003 | Breitwisch et al. |
| 2004/0061187 | A1* | 4/2004 | Weber et al. ................. 257/408 |
| 2005/0242340 | A1* | 11/2005 | Chidambarrao et al. ....... 257/19 |
| 2007/0238234 | A1* | 10/2007 | Wang et al. ................... 438/197 |
| 2007/0275532 | A1* | 11/2007 | Chidambarrao et al. ..... 438/300 |

OTHER PUBLICATIONS

Breitwisch, Matthew J., et al. "A Novel CMOS Compatible Embedded Nonvolatile Memory with Zero Process Adder," MTDT 2005.

* cited by examiner

*Primary Examiner* — Jae Lee
(74) *Attorney, Agent, or Firm* — Scully, Scott, Murphy & Presser, P.C.; Vazken Alexanian

(57) ABSTRACT

The invention provides a method to enhance the programmability of a prompt-shift device, which reduces the programming time to sub-millisecond times, by altering the extension and halo implants, instead of simply omitting the same from one side of the device as is the case in the prior art prompt-shift devices. The invention includes an embodiment in which no additional masks are employed, or one additional mask is employed. The altered extension implant is performed at a reduced ion dose as compared to a conventional extension implant process, while the altered halo implant is performed at a higher ion dose than a conventional halo implant. The altered halo/extension implant shifts the peak of the electrical field to under an extension dielectric spacer.

14 Claims, 6 Drawing Sheets

METHOD TO TAILOR LOCATION OF PEAK ELECTRIC FIELD DIRECTLY UNDERNEATH AN EXTENSION SPACER FOR ENHANCED PROGRAMMABILITY OF A PROMPT-SHIFT DEVICE

FIELD OF THE INVENTION

The present invention relates to a nonvolatile memory cell. More particularly, the present invention relates to a nonvolatile memory cell including at least one field effect transistor (FET) that has enhanced programmability. The invention also provides a method of fabricating such a nonvolatile memory cell.

BACKGROUND OF THE INVENTION

In the semiconductor industry, it is oftentimes desirable to fabricate a very large-scale integrated (VLSI) circuit which includes a one-time programmable (OTP) nonvolatile memory element that can be programmed either during wafer probing or after packaging of the semiconductor die. For example, programming of an OTP nonvolatile memory element is used to provide self-contained identification information about an individual IC die or die revision. OTP nonvolatile memory can also be used for remapping addresses of defective DRAM (dynamic random access memory) cells so that functional redundant memory cells are addressed instead. OTP nonvolatile memory may also provide hard-coded digital trimming data for precision analog elements.

There are several different methods known in the art to implement nonvolatile data storage on an IC die. In one method, metallic fuses can be selectively programmed by exceeding a certain current and thereby creating an open circuit in the fuse. This changes the resistance of the metallic fuse from an initial low-resistance to a high-programmed resistance.

In another method, antifuses are selectively programmed by applying a relatively high-programming voltage to break down a dielectric material contacted by two conductive terminals of the antifuse. This permanently changes the resistance presented by the antifuse from a high initial resistance to a low-programmed resistance. The programmed resistance obtained is typically on the order of several 1000 ohms.

In accessing the antifuse for a read operation, the programmed resistance is used, for example, to couple the input capacitance of a logic gate to a high logic level provided by a power supply, or, alternatively, to a low logic level provided by a connection to ground. The time required to charge or discharge the input capacitance of the logic gate is proportional to the product of the programmed resistance of the fuse and the input capacitance of the logic gate.

The required programming voltage of prior art fuses and antifuses to implement OTP nonvolatile memory storage is quite high (on the order of 10-12 volts) and oftentimes the high-programming voltages must be routed to other circuits in the IC which are not typically capable of withstanding such high voltages. Moreover, the introduction of high-voltage programmable fuses and antifuses into an IC die may require some redesigns and process modifications in order to avoid damage to the IC die. In some instances, extra processing steps are needed which increase the overall production cost of the IC die. In addition to requiring high-programming voltages, prior art fuses and antifuses occupy a large space on the IC die which detracts from the space were other ICs devices can be formed.

In addition to the above, a nonvolatile memory cell can be formed using a standard complementary metal oxide semiconductor (CMOS) field effect transistor (FET) utilizing a mechanism in the device wherein electrons are injected into the dielectric spacer region that abuts the patterned gate stack. Omitting the halo/extension implants will cause the FET to become underlapped, which enhances the device. Using an underlapped FET as a 'prompt-shift device' is disclosed, for example, in U.S. Pat. No. 6,518,614 to Breitwisch et al. and in a paper that was submitted at the MTDT 2005 conference entitled "A Novel CMOS Compatible Embedded Nonvolatile Memory with Zero Mask Adder".

Although the prompt-shift device disclosed in the above references provides a means for programming a nonvolatile memory cell the prior art prompt-shift devices require extremely long (on the order of about 1 to about 5 seconds) programming times.

In view of the above, there is a need for providing a prompt-shift device for use in a nonvolatile memory cell in which the programming time is less than 1 second.

SUMMARY OF THE INVENTION

The invention provides a method to enhance the programmability of a prompt-shift device, and thus reduce the programming time to sub-millisecond times.

The term "prompt-shift device" is used throughout the present application to denote a FET including an underlapped diffusion structure. By 'underlapped diffusion structure' it is meant a diffusion structure (e.g., source/drain regions) in which no part thereof is located directly beneath the gate. Instead, the underlapped diffusion structure of the invention includes a portion that is located directly beneath the source/drain dielectric spacer. The underlapped diffusion structure induces hot electron injection into overlying dielectric spacers when the underlapped junction is biased as the drain. Electrons stored in the dielectric spacers modulate the source resistance of the memory cell when the underlapped junction is biased as the source in a read operation. Stored electrons are erased using hot hole injection. All the operations of the memory cell are performed with voltages no more than 5, preferably less than 3.5, V that can be obtained from a standard input/output supply without charge pumping.

As stated above, the invention provides a method to enhance the programmability of a prompt-shift device and thus reduce the programming time to sub-millisecond times, by altering the extension and halo implants (hereinafter halo/extension implants), instead of simply omitting the same from one side of the device as is the case in the prior art prompt-shift devices mentioned above.

The invention uses an altered halo/extension implant to adjust (i.e., tailor) the junction profile to enhance the electric field directly beneath the extension dielectric spacer. One key feature of the altered implant in the invention is the halo (p-type for an nFET and n-type for a pFET) strength and location. In particular, the applicants have determined that increasing the halo dose (in a range from about 1.5 to 3 times greater the standard halo dose) enhances the electric field of the device during operation. Also, the applicants have determined that moving the halo implant after the extension dielectric spacer has been formed shifts the peak electric field to a location that is directly under the extension dielectric spacer. The term "peak electric field" denotes the region in the channel during the programming condition where the electric field is the highest. It is at this peak electric field location that electrons will have a maximum probability of being transferred from the channel into the above lying region. In comparison, and in conventional CMOS technology, it is common to perform the nFET extension and halo implants without the presence of any spacer. The pFET extension and halo implants in conventional CMOS processing are typically performed after the extension dielectric spacer has been formed.

The present invention discloses two methods that can be used to fabricate a prompt-shift device in which the programmability thereof is less than 1 second, preferably within the sub-millisecond time range. In one embodiment of the present invention, no additional masks are used during the fabrication of the inventive prompt-shift device. In this embodiment of the invention, the altered halo/extension implant is performed to all the devices present on the substrate, e.g., the memory devices as well as the logic devices. Moreover, the no additional mask embodiment of the present invention provides a prompt-shift device including symmetric, yet altered halo/extension regions on both sides of the device. In another embodiment of the invention, an additional mask is used and is formed atop a portion of the memory device and the logic devices during the altered halo/extension implant. This embodiment of the invention permits the formation of asymmetric, yet altered halo/extension implant regions into only the memory devices independently from the other devices.

In general terms, the method of the present invention comprises:

providing at least one field effect transistor within a memory area of a semiconductor substrate, said at least one field effect transistor including a patterned gate region and an extension dielectric spacer located on sidewalls of said patterned gate region;

performing an extension ion implant into at said semiconductor substrate and on at least one side of the patterned gate region, said extension ion implant uses an ion dosage that is less than about $5E14$ atoms/cm$^2$;

performing a halo ion implant into said semiconductor substrate and on at least one side of the patterned gate region, said halo ion implant uses an ion dosage of greater than about $1E13$ atoms/cm$^2$;

forming a source/drain dielectric spacer onto exposed surfaces of said extension dielectric spacer; and forming source and drain regions on both sides of said patterned gate region using said source/drain dielectric spacers as an implant mask.

In one embodiment of the invention, a mask is formed prior to performing the extension ion implant and said mask remains in the structure until after performing the halo ion implant. This embodiment of the present invention results in a prompt-shift device having asymmetric, yet altered extension/halo implant regions.

In another embodiment of the invention, no additional mask is present during the extension and halo implants. In this embodiment, a prompt-shift device having symmetric, yet altered extension/halo implant regions is provided.

In yet another embodiment of the present invention, the halo ion implant includes a first ion implant step, followed by a second ion implant step. In this two-step halo implant, the first and second ions are of the same conductivity type, yet they are comprised of different dopant ions.

In a further embodiment of the invention, the at least one field effect transistor is an n-FET, the extension ion implant includes selecting an ion from Group VA of the Periodic Table of Elements, and the halo implant includes selecting an ion from Group IIIA of the Periodic Table of Elements. In a highly preferred embodiment, the Group VA ion for the extension implant is As, and the Group IIIA ion for the halo implant includes a combination of In as a first ion, and B as a second ion.

In another aspect of the present invention, a prompt-shift device is provided that comprises:

a semiconductor substrate having at least one field effect transistor located within a memory area of said substrate, said at least one field effect transistor including a patterned gate region, an extension dielectric spacer abutting sidewalls of said patterned gate region, and a source/drain dielectric spacer abutting sidewalls of said extension dielectric spacer;

an altered extension region located within said semiconductor substrate and on at least one side of said patterned gate region, said altered extension region having an extension ion dopant concentration of less than about $1E20$ atoms/cm$^3$;

an altered halo region located within said semiconductor substrate and on at least one side of said patterned gate region, said altered extension region having a halo ion dopant concentration of greater than about $5E18$ atoms/cm$^3$, said altered halo region is in direct contact with said altered extension region;

source and drain regions located within said semiconductor substrate and on both sides of said patterned gate region, said source and drain regions are underlapped so that a portion thereof is located beneath the source/drain dielectric spacer, and wherein said altered extension region and said altered halo region provide a peak electrical field beneath the extension dielectric spacer.

BRIEF DESCRIPTION OF THE DRAWINGS

FIG. 1A illustrates a prompt-shift device including an asymmetric, yet altered halo/extension region, while FIG. 1B illustrates a prompt-shift device including a symmetric, yet altered halo/extension region.

DETAILED DESCRIPTION OF THE INVENTION

The present invention, which provides a prompt-shift device having enhanced programmability and a method of fabricating the same, will now be described in greater detail by referring to the following discussion and drawings that accompany the present application. It is noted that the drawings of the present application are provided for illustrative purposes only, and as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1A:
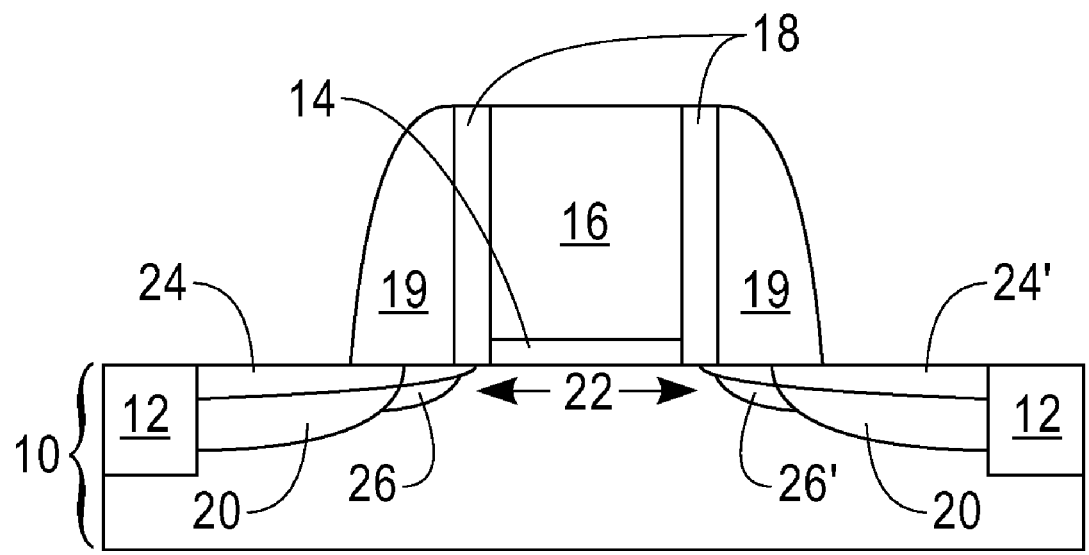
FIGS. 1A-1B are pictorial representation (through cross sectional views) depicting the prompt-shift devices of the present application.
Figure 1B:
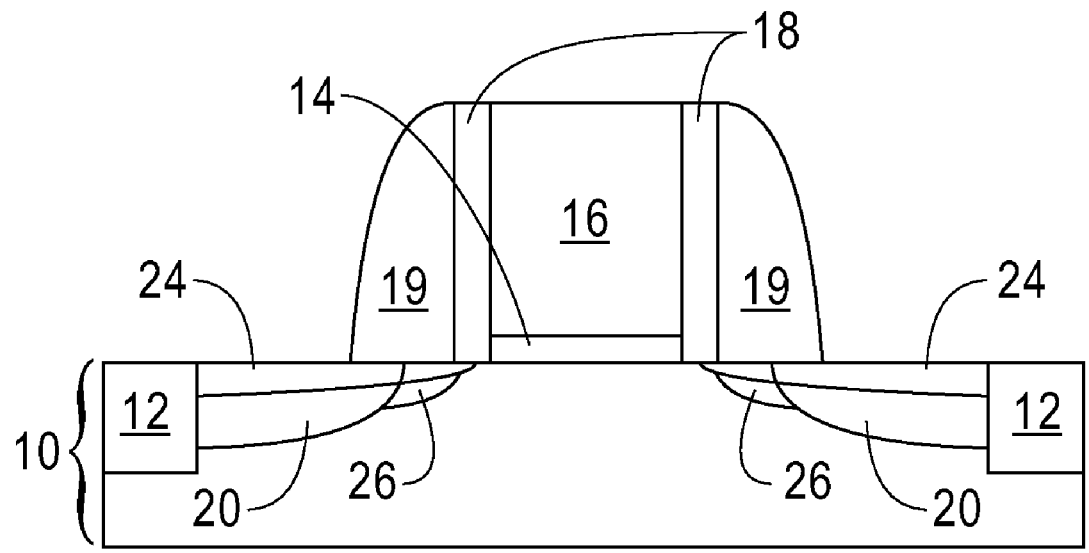

Reference is first made to FIGS. 1A and 1B which are pictorial representations (through cross-sectional views) showing different embodiments of the inventive prompt-shift device. The prompt-shift device illustrated in FIG. 1A includes asymmetric, yet altered halo/extension regions, whereas the prompt-shift device illustrated in FIG. 1B includes symmetric, yet altered halo/extension regions.

Specifically, each prompt-shift device is an underlapped FET which comprises semiconductor substrate 10 having isolation regions 12 located in, or partially within, a surface of substrate 10. Each underlapped FET device shown in FIGS. 1A-1B also includes gate dielectric 14 present on a portion of substrate 10, gate conductor 16 present atop gate dielectric 14, an extension dielectric spacer 18 present on at least the exposed vertical sidewalls of the gate dielectric and gate conductor, and a source/drain dielectric spacer 19 present on the exposed walls of the extension dielectric spacer 18.

Source/drain (S/D) regions 20 are located in the surface of the substrate, and as shown, the S/D regions are not present beneath the gate conductor. A channel region 22 is located in the substrate beneath the gate region (which is defined by the gate dielectric and the gate conductor). The inventive structure shown in FIG. 1A also includes an altered extension implant region 24 located within the semiconductor substrate 10 on one side of the device. Region 26 denotes an altered halo implant region which is formed one side of the device in this embodiment of the invention. It is noted that the source/drain regions, the altered extension region and the altered halo region are located at the footprint of at least one field effect transistor. In FIG. 1A, reference numeral 26' denotes a non-altered halo implant region, while reference numeral 24' denotes a non-altered extension implant region.

The inventive structure shown in FIG. 1B also includes an altered extension implant region 24 located within the semiconductor substrate 10 on both sides of the device. Region 26 denotes the altered halo implant region which is formed on both sides of the device in the present invention. It is noted that the source/drain regions, the altered extension region and the altered halo region are located at the footprint of at least one field effect transistor.

During programming of the prompt-shift device of the present invention using programming voltages of less than about 5 V, preferably about 3.5 V or less, charge gets trapped outside of the channel region such as in the extension dielectric spacer, not within the channel region as is the case with prior art FETs in which extension implant regions are present beneath the gate region. In the present invention, the prompt-shift device is programmed by hot-electron injection into regions of the FET outside the channel region when relatively low-programmable voltages (less than about 5 V) are employed.

The programmable state of the inventive prompt-shift device can be read using a sense amplifier or other like device which is capable of reading the programmable state of the underlapped device. For clarity, the sense amp is not depicted in the drawings of the present invention.

Due to the presence of altered halo/extension implant regions which are formed using a tailored prompt-shift implant process (to be discussed in greater detail below), the inventive prompt-shift device has enhanced programmability, in which the programming time is reduced below 1 second, in particular the inventive prompt-shift device can be programmed in the sub-millisecond time range.

The inventive prompt-shift devices shown in FIGS. 1A-1B will have a shift in threshold voltage due to channel hot-electrons injected from the substrate into the extension dielectric spacer 18 (and some charge may get trapped in gate dielectric 14) much more readily than prior art overlapped and underlapped FETs; this shift in threshold voltage is referred to herein as a 'prompt-shift'. The present invention uses this phenomenon to build a very dense memory array.

The programming mechanics of the inventive prompt-shift device include the following: Pulse drain and gate voltage to 3.5 V, while grounding the source and substrate to program a "0" state. "1" state is non-programmed state. To read the state, apply 2.5 V to the gate, 50 mV to the drain, ground the source and the substrate and measure the drain current. Note that the foregoing represents one possible way to program the inventive prompt-shift device, and that other ways may also be employed in the present invention.

Figure 2A:
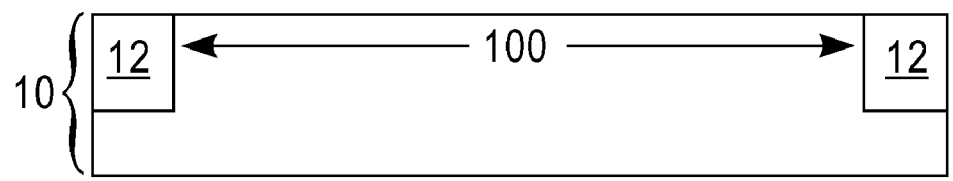
FIGS. 2A-2G are pictorial representations (through cross sectional views) depicting the basic processing steps employed in a first embodiment of the present invention in which one additional mask is employed during the fabrication of the inventive prompt-shift device shown in FIG. 1A.
Figure 2B:
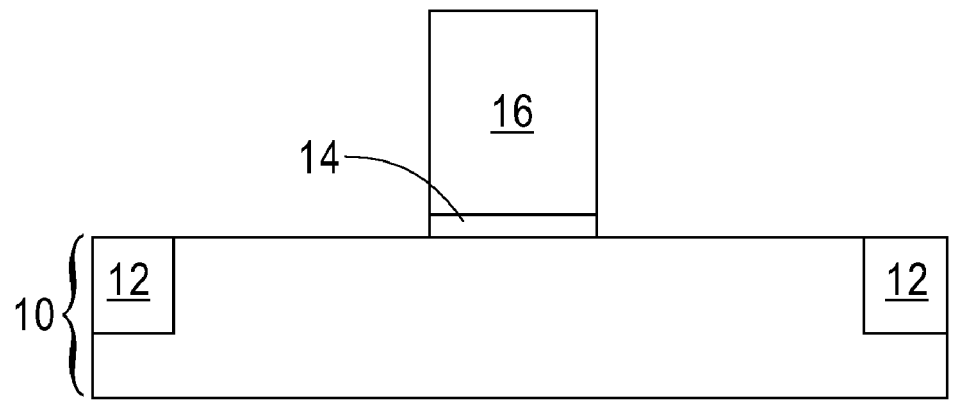
Figure 2C:
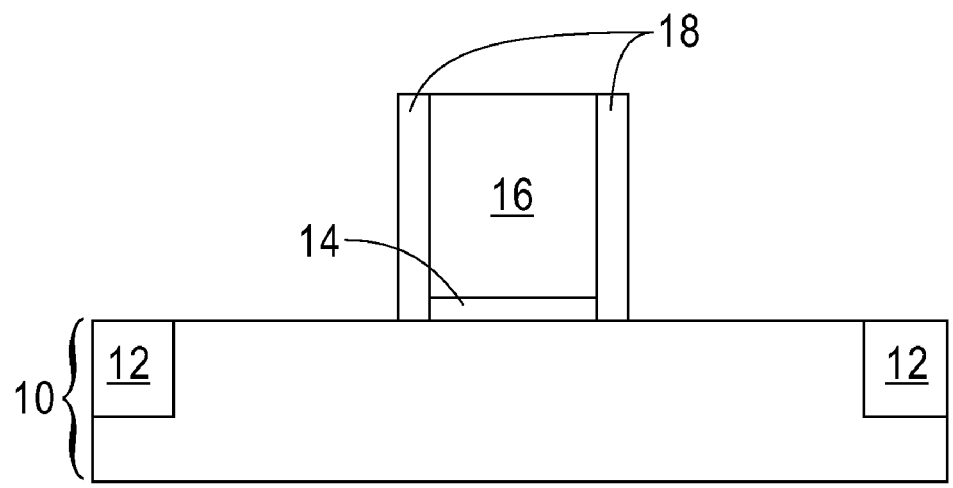
Figure 2D:
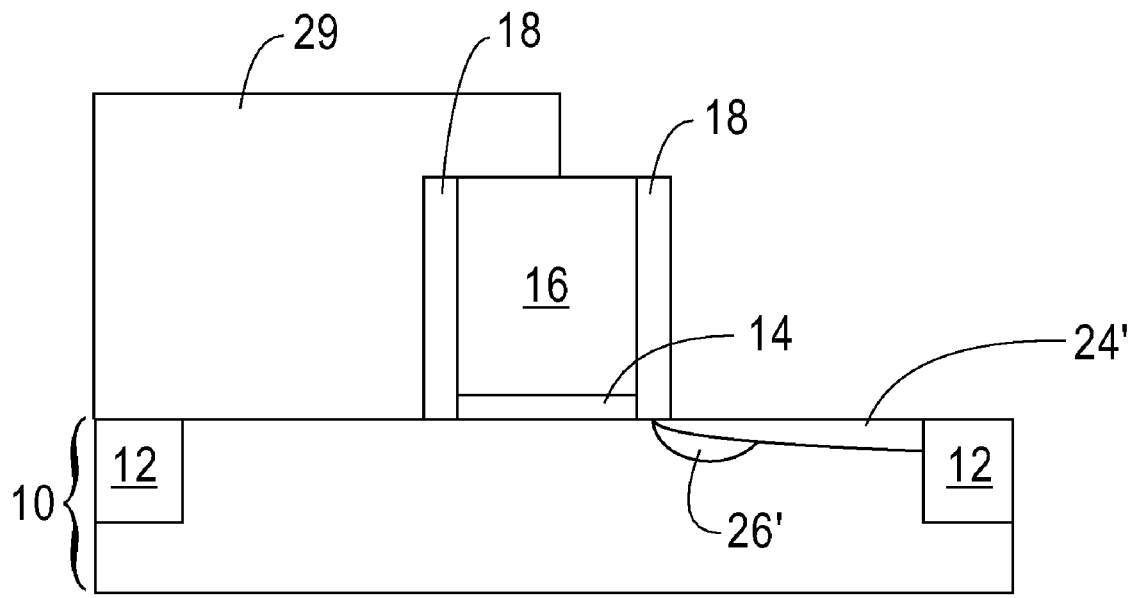
Figure 2E:
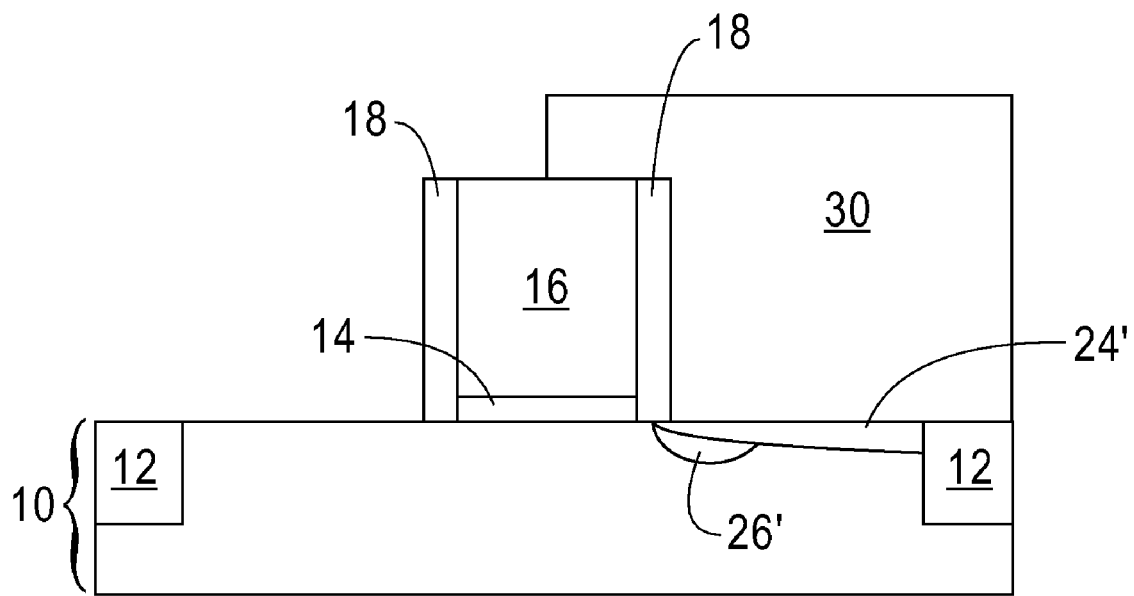
Figure 2F:
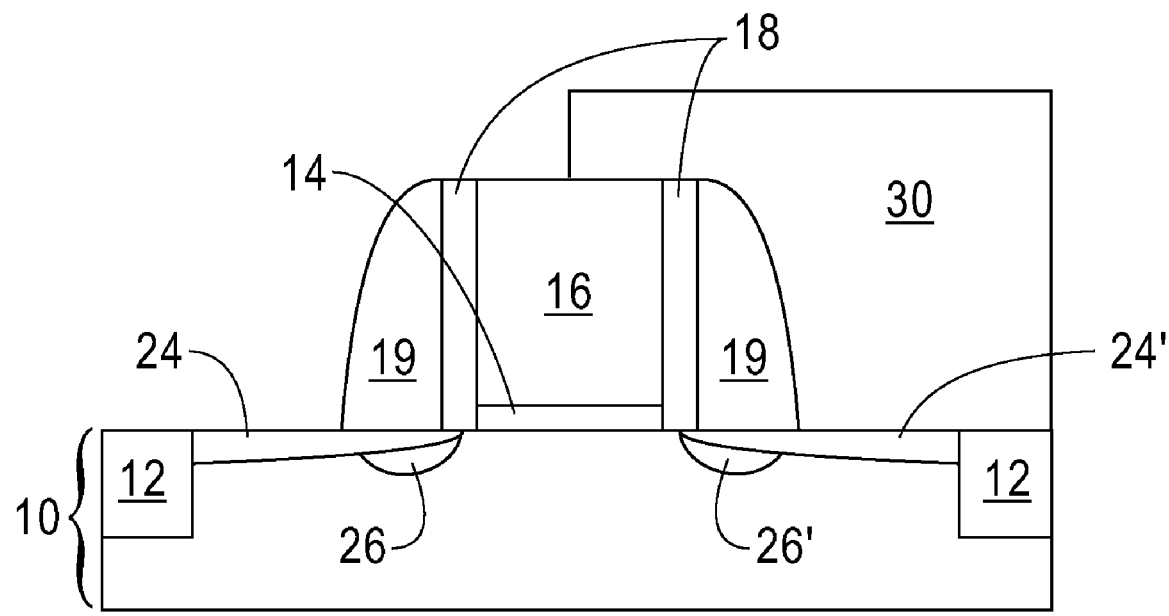
Figure 2G:
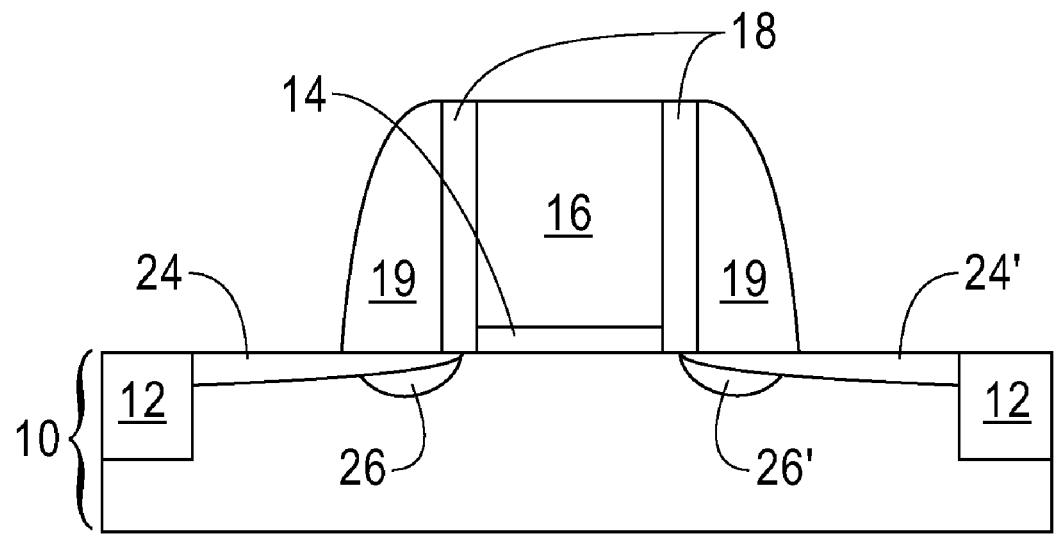
Figure 3A:
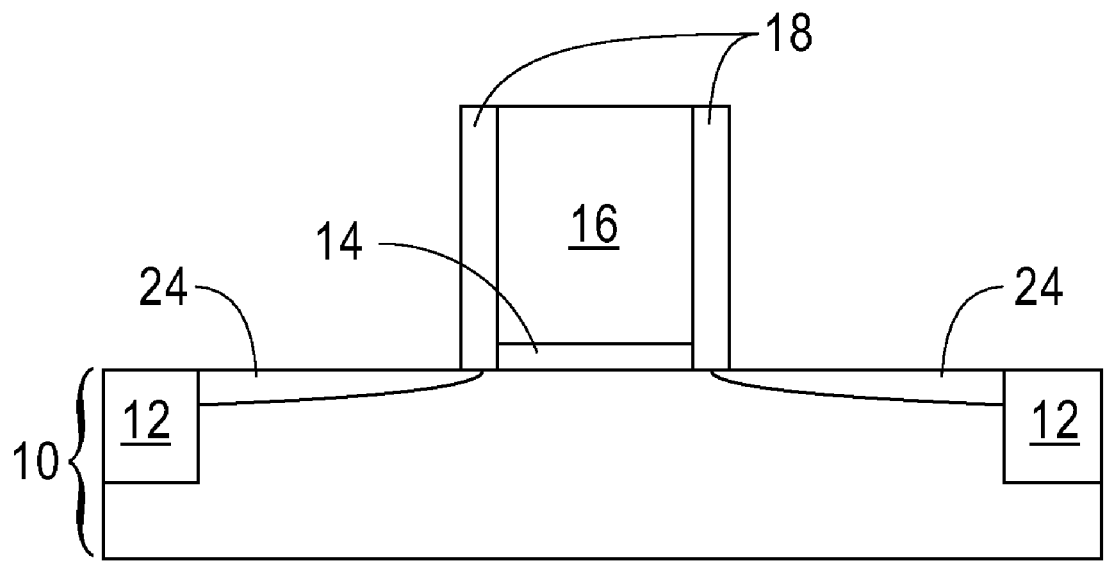
FIGS. 3A-3B are pictorial representations (through cross sectional views) depicting the basic processing steps employed in a second embodiment of the present invention in which no additional mask is employed during the fabrication of the inventive prompt-shift device shown in FIG. 1B.
Figure 3B:
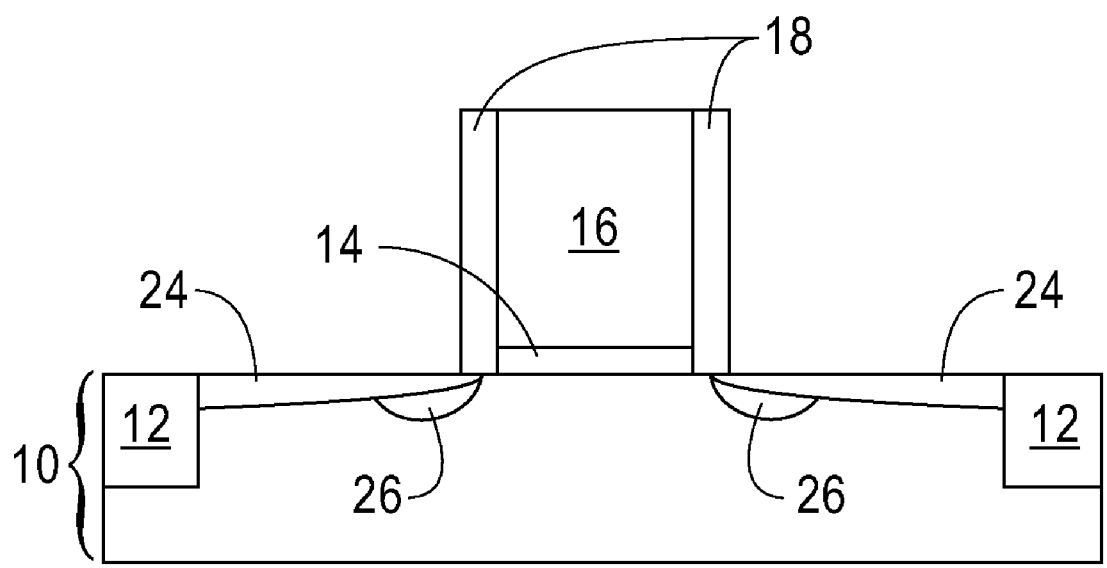

The structures shown in FIGS. 1A-1B are comprised of conventional materials well known to those skilled in the art and the structure is fabricated using either the processing steps which are shown in FIGS. 2A-2G for the structure shown in FIG. 1A or the processing steps shown in FIG. 3A-3B for the structure shown in FIG. 1B.

Reference is first made to the processing steps shown in FIGS. 2A-2G in which a conventional CMOS processing flow is shown with the introduction of an additional mask and an altered halo/extension implant that are used in forming asymmetric, yet altered halo/extension implant regions. The embodiment shown in FIGS. 2A-2G allows one to tailor the asymmetric, yet altered halo/extension implant regions independently from all other devices.

FIG. 2A shows an initial structure that is employed in fabricating the inventive prompt-shift device shown in FIG. 1A. Specifically, FIG. 2A comprises a semiconductor substrate 10 which has isolation regions 12 formed therein. The isolation regions electrically isolate various IC devices from other types of IC devices present in the substrate. Specifically, in FIG. 2A, some of the isolation regions separate the memory area (labeled as 100) where the inventive prompt-shift device is to be formed from the logic areas where a typically logic FET is to be formed. The logic areas are located to the periphery of the memory area illustrated in the drawings.

The semiconductor substrate 10 employed in the present invention comprises any conventional semiconducting material, including, but not limited to Si, Ge, SiGe, GaAs, TnAs, InP and all other III/V semiconducting compounds. Layered substrate comprising the same or different semiconducting material, e.g., Si/SiGe, and silicon-on-insulators (SOIs) are also contemplated herein. The substrate may be of the n or p-type depending on the desired device to be fabricated.

In some embodiments of the present invention, the semiconductor substrate 10 may comprise a hybrid oriented substrate which contains surface regions that have different surface orientations. The different surface orientations can be used to enhance the carrier mobility of a particular FET.

In other embodiments of the present invention, the semiconductor substrate 10 may be strained, unstrained or it may contain strained and unstrained regions and/or layers therein.

Isolation regions 12, which may be local oxidation of silicon isolation (LOCOS) regions or trench isolation regions, are formed in portions of semiconductor substrate 10 using conventional processes well known to those skilled in the art. For example, LOCOS regions are formed using a conventional LOCOS process in which exposed portions of substrate 10 that are not protected by a patterned nitride layer are thermally oxidized. The patterned nitride layer is then removed using a conventional stripping process that is highly selective in removing nitride as compared to Si.

Trench isolation regions are formed by first providing a patterned hardmask on the surface of the substrate using conventional deposition, lithography and etching processes well known to those skilled in the art. A timed etching process is then employed which forms trenches of a desired depth into exposed surfaces of the substrate. The trenches may be optionally lined with a liner material prior to filling of the trench with a trench dielectric material such as TEOS (tetraethylorthosilicate) or $SiO_2$. In some instances, the trench dielectric material may be planarized after deposition and/or a conventional densification process may be employed to increase the density of the trench dielectric material. The hardmask used in defining the trenches may be removed anytime after the trenches have been formed in the substrate using a conventional stripping process that is highly selective in removing a hardmask material from the structure. It is noted that in the drawings isolation regions 12 are depicted as trench isolation regions.

Next, and as depicted in FIG. 2B, a patterned gate region including a gate dielectric 14 and a gate conductor 16 is then formed on exposed portions of substrate 10 that do not include the isolation regions. Specifically, the gate dielectric 14 is formed on the surface of substrate 10 using a conventional deposition process such as chemical vapor deposition (CVD), plasma-assisted CVD, evaporation or chemical solution deposition. Alternatively, the gate dielectric 14 is formed by a conventional thermal growing process such as, for example, thermal oxidation. Gate dielectric 14 is composed of any dielectric material including, but not limited to an oxide, a nitride, an oxynitride or any combination thereof. The thickness of the gate dielectric 14 may vary and is not critical to the present application. Typically, the gate dielectric 14 has a thickness from about 2.0 to about 10.0 nm, with a thickness from about 4.0 to about 6.0 nm being more highly preferred. Note that the thickness of the gate dielectric 14 used in forming the inventive prompt-shift device underlapped FET may be the same or different than the other FET devices present in the structure.

The gate dielectric 14 may be patterned at this point of the inventive process using conventional lithography and etching, or the gate dielectric 14 may be patterned at a later time, e.g., at the same time as the gate conductor 16. The latter is preferred since it reduces the number of processing steps required in fabricating the gate region.

Gate conductor 16 is then formed atop the gate dielectric 14 using a conventional deposition process such as CVD, plasma-assisted CVD, evaporation, sputtering or chemical solution deposition. The gate conductor 16 is composed of any conductive material including, but not limited to doped polysilicon or SiGe; a conductive elemental metal such as W, Pt, Pd, Ru, Rh and Ir; alloys which include at least one conductive elemental metal; silicides or nitrides of at least one of the above-mentioned conductive elemental metals; or any combination thereof. When a combination of conductive materials is employed, an optional diffusion barrier material such as SiN, TaN, TaSiN, WN or $TaSi_2$ may be formed between each of the conductive materials. Note that a polysilicon or SiGe gate conductor may be formed using a conventional in-situ doping deposition process or, alternatively, the polysilicon or SiGe gate conductor may be formed by deposition and ion implantation.

The thickness of the gate conductor 16 may vary and is not critical to the present invention. Typically, however, the gate conductor 16 has a thickness from about 50 to about 250 nm, with a thickness from about 150 to about 200 nm being more highly preferred. The gate conductor 16, and if not previous patterned, the gate dielectric 14, may be now patterned using conventional lithography and etching. A dielectric cap, such as a nitride cap, not shown, may be formed atop the gate conductor 16 prior to patterning the gate region using conventional processes well known to those skilled in the art.

Next, and as shown in FIG. 2C, at least one extension dielectric spacer 18 which is composed of a conventional dielectric such as an oxide, nitride, oxynitride or any combination thereof, is formed about each patterned gate region so as to protect at least the exposed sidewalls of the gate dielectric and gate conductor. In one embodiment, the extension dielectric spacer 18 is comprised of a nitride. The extension dielectric spacer 18 is formed using conventional processes well known to those skilled in the art, including, for example, deposition and, optionally, etching. Prior to spacer formation, the exposed sidewalls of the gate dielectric and gate conductor may be subjected to a conventional sidewall oxidation process which forms an oxide region (not shown) on the exposed sidewalls. Note that the extension dielectric spacer 18 is a thin spacer relative to the source/drain dielectric spacer to be subsequently formed.

Next, and as shown in FIG. 2D, a mask 29 is formed so as to block one side of the structure, i.e., patterned gate region, while leaving another side unprotected. Conventional extension implants and halo implants are performed using conventional conditions well known in the art so as to form a non-altered extension implant region 24' and a non-altered halo implant region 26' on the side of the structure that is not protected. The mask 29 and the additional mask 30 to be used in the next step of the present invention comprise any conventional masking materials including photoresists, hardmasks and multilayers thereof. Each mask 29, 30 is formed by deposition, lithography and etching and the masks are removed after the implants utilizing conventional mask stripping processes well known to those skilled in the art. The non-altered extension implant region 24' and the non-altered halo implant region 26' differ from the altered counterparts in at least doping concentration. The extension regions within the logic device can be formed utilizing mask 29.

At this point of the invention, an additional mask 30, shown as shown in FIG. 2E, is at least formed over a portion of the patterned gate region in the memory device area 100. The additional mask 30 may be formed over the patterned gate region in the logic device area as well. Note that one side of the patterned gate region in the memory device area 100 is exposed.

With the additional mask 30 in place, an altered extension implant and an altered halo implant (collectively referred to herein as an altered halo/extension implant) are employed. By "altered extension implant" it is meant that the extension implant is performed at a reduced dosage as compared to a conventional extension implant (a conventional extension implant is performed using an ion dose that is about 5E14 atoms/cm$^2$ or greater). The term "altered halo implant" denotes that the halo implant is performed at a higher dosage than a conventional halo implant (a conventional halo implant is performed using an ion dose that is typically about 1E13 atoms/cm$^2$ or less).

The altered halo/extension implant includes first performing an extension implant using a reduced ion implant dosage as compared to a conventional extension implant and then performing a first halo implant using a higher ion implant dosage as compared to a conventional halo implant. A second halo implant also using the higher ion implant dosage than a conventional halo implant may optionally be performed. When the second halo implant is performed, the ion of the first halo implant is different from the ion of second halo implant.

In particular, the altered extension implant is performed using an n-type ion (i.e., an ion such as P, As, and Sb from Group VA of the Periodic Table of Elements) or a p-type ion (i.e., an ion such as B, Al, In from Group IIA of the Periodic Table of Elements). The type of dopant ion implanted will depend on the conductivity type of device being fabricated. For example, an n-type extension implant is used in forming an nFET, while a p-type extension implant is used for forming a pFET. In a preferred embodiment of the invention, nFETs are formed within the memory area 100. In the preferred embodiment, the extension implant includes arsenic as the n-type dopant for the extension region, In as the ion for the first halo implant and B as the ion for the optional second halo implant.

The altered extension implant is performed at an angle, as measured relative to the surface of the substrate, of from 0° to about 30°, with an angle from 5° to about 10° being more preferred. The altered extension implant of the present invention is performed at an energy from about 5 to about 50 KeV, with an energy from about 10 to about 20 KeV being more preferred for the altered extension implant. As stated above, the altered extension implant is performed using an ion dosage that is less than 5E14 atoms/cm$^2$ (i.e., the dosage of a conventional extension implant). More preferably, the altered extension implant of the present invention is performed using an ion dosage from about 1E13 to about 5E14 atoms/cm$^2$. In an even more preferred embodiment of the invention, the altered extension implant is performed using an ion dosage of about 1E14 atoms/cm$^2$.

Next, and with mask 30 also in place, the altered halo implant is performed. As indicated above, the altered halo implant may include a first halo implant using a first ion, and optionally a second halo implant using a second ion that has the same conductivity, yet differs from the first ion. The type of ion used in the halo implant may vary and includes, an ion that is of a different conductivity type as compared to the ion implanted into the altered extension region. In the preferred embodiment, in which an nFET is formed, the first halo implant includes an ion from Group IIIA such as, for example, B, Al, and In, with In being preferred. When the optional second halo implant is performed in the preferred embodiment, the ion of the optional second implant is an ion from Group IIIA other than the ion used in the first halo implant. Preferably, and when the ion of the first halo implant is In, the ion of the second halo implant is B.

The altered first halo implant is performed at an angle, as measured relative to the surface of the substrate, of from about 11° to about 30°, with an angle from about 20° to about 30° being more preferred. The altered first halo implant of the present invention is performed at an energy from about 50 to about 200 KeV, with an energy from about 10 to about 140 KeV being more preferred for the altered first halo implant. As stated above, the altered first halo implant is performed using an ion dosage that is greater than 1E13 atoms/cm$^2$ (i.e., the dosage of a conventional halo implant). More preferably, the altered first halo implant of the present invention is performed using an ion dosage from about 3E13 to about 5E14 atoms/cm$^2$. In an even more preferred embodiment of the invention, the altered first halo implant is performed using an ion dosage of about 6E13 atoms/cm$^2$.

When altered second halo implant is performed at an angle, as measured relative to the surface of the substrate, of from about 5° to about 3°, with an angle from about 5° to about 15° being more preferred. The altered second halo implant of the present invention is performed at an energy from about 5 to about 50 KeV, with an energy from about 10 to about 20 KeV being more preferred for the altered second halo implant. As stated above, the altered second halo implant is performed using an ion dosage that is also greater than 1E13 atoms/cm$^2$ (i.e., the dosage of a conventional halo implant). More preferably, the altered second halo implant of the present invention is performed using an ion dosage from about 2E13 to about 5E14 atoms/cm$^2$. In an even more preferred embodiment of the invention, the altered second halo implant is performed using an ion dosage of about 4.2E13 atoms/cm$^2$.

At this point of the invention, an activation anneal step may be performed to activate the implanted dopant ions. The activation anneal step may also be omitted and performed in a later time of the inventive process, i.e., after formation of the source/drain regions. The conditions of the activation anneal may vary and are well known to those skilled in the art. Typically, the activation anneal is performed at a temperature of about 800° C. or greater.

The structure after performing the above altered halo/extension implant is shown in FIG. 2F. In this drawing, reference numeral 24 denotes the 'altered' extension region of the invention, and reference numeral 26 denotes the 'altered' halo extension region. After formation of altered regions 24 and 26, the additional mask 30 is removed from the structure utilizing a conventional stripping process well known to those skilled in the art.

The altered extension region 24 that is formed using the altered extension implant has an extension dopant ion concentration of less than about 1E20 atoms/cm$^3$, with an extension dopant ion concentration from about 1E19 to about 8E19 being more preferred. The altered halo region 26 that is formed has a halo dopant ion concentration of greater than about 5E18 atoms/cm$^3$, with a halo ion concentration from about 8E18 to about 5E19 being more preferred.

Next, and as shown in FIG. 2G, a source/drain dielectric spacer 19 which may be composed of the same or different insulator material as the extension dielectric spacer 18 is formed on the exposed sidewalls of the extension dielectric spacer 18 by deposition and etching. In a preferred embodiment of the invention, and when the extension dielectric spacer 18 comprises a nitride, the source/drain dielectric spacer 19 comprises a nitride/oxide stack. Note that source/drain dielectric spacer 19 is thicker than the extension dielectric spacer 18.

Next, source/drain diffusion regions (herein after source/drain regions) 20 are formed in substrate 10 about each patterned gate region, e.g., at the footprint of each patterned gate region. The source/drain regions are formed using a conventional ion implantation process followed by an activation annealing process that is performed at a temperature of about 800° C. or higher. The resultant structure after forming the source/drain regions 20 is shown in FIG. 1A. Note that in this figure the source/drain regions are not present beneath the gate region in the memory region. Hence, the illustrated FET device of FIG. 1A is an underlapped device that can be employed as an OTP element.

Because the inventive FET is greatly underlapped, increased hot-electron injection into other regions of the FET beside the channel occurs. In one embodiment, the increased hot-electron injection occurs into the spacers, particularly the extension dielectric spacer 18, that abut the gate region. The increased hot-electron injection results in a FET device that has a 50% or greater, preferably 100%, increase in the source-to-drain resistance as compared to FETs that contain overlapped source/drain regions.

Also, since an altered halo/extension implant has been performed, the peak electric field is shifted from under the gate dielectric 14 to under the extension dielectric spacer 18 and, as such, the inventive prompt-shift device can be programmed much more quickly as compared to conventional FETs or prompt shift devices fabricated in U.S. Pat. No. 6,518,614.

Reference is now made to FIGS. 3A-3B which illustrate the sequence of processing used in forming the structure shown in FIG. 1B, i.e., the prompt-shift device including symmetric, yet altered extension and halo regions. In this embodiment of the present invention, the structure shown in FIG. 2C is first provided using the processing sequence described above. Unlike the first embodiment, no additional mask 30 is applied to the structure shown in FIG. 2C. The structure including no additional mask 30 is then subjected to the altered extension implant and the altered halo implant mentioned above. FIG. 3A illustrates the structure after the altered extension implant has been performed, while FIG. 3B illustrates the structure after the altered halo implant has been performed. After performing the altered halo/extension implant, the source/drain dielectric spacer 19 and the source/drain regions 30 are formed as described above. Since no additional mask is employed in this embodiment, a prompt-shift device including a symmetric, yet altered halo/extension region is provided.

The resultant structure after forming the source/drain regions 20 is shown in FIG. 1B. Note that in this figure the source/drain regions are not present beneath the gate region in the memory region. Hence, the illustrated FET device of FIG. 1B is an underlapped device that can be employed as an OTP element.

Because the inventive FET is greatly underlapped, increased hot-electron injection into other regions of the FET beside the channel occurs. In one embodiment, the increased hot-electron injection occurs into the spacers, particularly the extension dielectric spacer 18, that abut the gate region. The increased hot-electron injection results in a FET device that has a 50% or greater, preferably 100%, increase in the source-to-drain resistance as compared to FETs that contain overlapped source/drain regions.

Also, since an altered halo/extension implant has been performed, the peak electric field is shifted from under the gate dielectric 14 to under the extension dielectric spacer 18 and, as such, the inventive prompt-shift device can be programmed much more quickly as compared to conventional FETs or prompt shift devices fabricated in U.S. Pat. No. 6,518,614.

Figure 4:
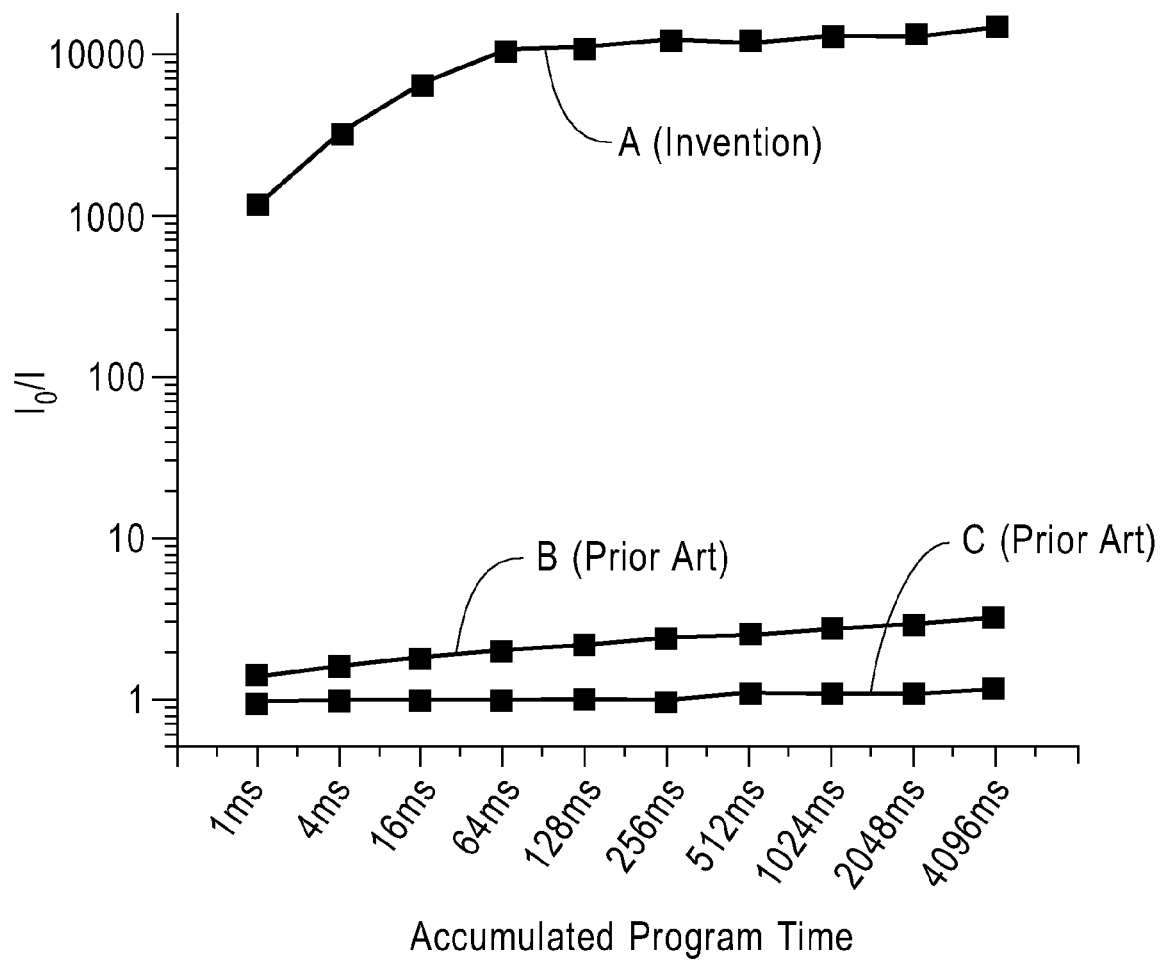
FIG. 4 is a plot of $I_o/I$ vs. accumulated program time of the inventive prompt-shift device (curve A), a prior art prompt-shift device (curve B) and a conventional nFET.

Reference is now made to FIG. 4 which is a plot of $I_o/I$ vs. accumulated program time of the inventive prompt-shift device (curve A), a prior art prompt-shift device (curve B) and a conventional nFET. It is observed that $I_o/I$ (which is plotted on the y-axis) represents the programmability of the device. That is, $I_o/I$ equal the I_non-programmed/I_programmed. As shown the inventive prompt-shift device has a greater enhanced programmability as compared to the prior art devices shown in FIG. 4. The inventive prompt-shift device illustrated as curve A includes an asymmetric, yet altered halo/extension implant region in which the following conditions were used: Arsenic extension implant dose 1E14 atoms/cm$^2$, a B first halo implant dose 1.05E13 atoms/cm$^2$, and an In second halo implant dose (1.5E13 atoms/cm$^2$). The prior art prompt-shift device represented by curve B was made utilizing the basic process disclosed in U.S. Pat. No. 6,518,614. The nFET represented by curve C is a conventional overlapped device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A method of fabricating a prompt-shift semiconductor device comprising:
   providing at least one field effect transistor within a memory area of a semiconductor substrate, said at least one field effect transistor including a patterned gate region and an extension dielectric spacer located on sidewalls of said patterned gate region;
   performing an extension ion implant into said semiconductor substrate and on at least one side of the patterned gate region, said extension ion implant uses an ion dosage that is less than about 5E14 atoms/cm$^2$, wherein said extension ion implant forms an extension region on the at least one side of the patterned gate region, said extension region has a terminal point that is located beneath said extension dielectric spacer and not aligned to an edge of said extension dielectric spacer or an edge of said patterned gate region;
   performing a halo ion implant into said semiconductor substrate and on said at least one side of the patterned gate region, said halo ion implant uses an ion dosage of greater than about 1E13 atoms/cm$^2$, said halo ion implant forms a halo implant region on the at least one side of the patterned gate region, said halo implant region has a terminal point located directly beneath said extension dielectric spacer and not aligned to an edge of said extension dielectric spacer or an edge of said patterned gate region;
   forming a source/drain dielectric spacer onto exposed surfaces of said extension dielectric spacer; and
   forming source and drain regions on both sides of said patterned gate region using said source/drain dielectric spacer as an implant mask, wherein said source and drain regions have a terminal point that is located beneath said source/drain dielectric spacer and not aligned to any edge of the source/drain dielectric spacer.

2. The method of claim 1 further comprising forming a mask prior to performing said extension ion implant, said mask protects one side of the patterned gate region, while leaving another side of the patterned gate region unprotected and thus capable of receiving said extension ion implant and said halo ion implant.

3. The method of claim 2 wherein said mask is removed after performing said halo ion implant.

4. The method of claim 1 wherein said halo ion implant comprises a first halo ion implant step using a first halo ion, and a second halo ion implant step using a second halo ion.

5. The method of claim 1 wherein said at least one field effect transistor is an nFET, and said performing said extension ion implant includes selecting an extension dopant ion from Group VA of the Periodic Table of Elements and said performing said halo ion implant includes selecting a halo dopant ion from Group IIIA of the Periodic Table of Elements.

6. The method of claim 1 wherein said performing said extension ion implant includes using an energy from about 5 to about 50 KeV and an implant angle of from 0° to about 30° as measured from a surface of said semiconductor substrate.

7. The method of claim 1 wherein said performing said halo ion implant includes implanting a first halo ion using an energy from about 50 to about 200 KeV and an implant angle of from about 10° to about 30° as measured from a surface of said semiconductor substrate.

8. The method of claim 7 wherein said performing said halo ion implant includes a second halo implant that comprises implanting a second halo ion using an energy from about 5 to about 50 KeV and an implant angle of from about 10° to about 30° as measured from a surface of said semiconductor substrate.

9. A method of fabricating a prompt-shift semiconductor device comprising:
providing at least one field effect transistor within a memory area of a semiconductor substrate, said at least one field effect transistor including a patterned gate region and an extension dielectric spacer located on sidewalls of said patterned gate region;
forming a mask that blocks one side of said patterned gate region of said at least one field effect transistor, while leaving another side of said patterned gate region of said at least one field effect transistor unprotected;
performing an extension ion implant into said semiconductor substrate and on said another side of the patterned gate region of said at least one field effect transistor, said extension ion implant uses an ion dosage that is less than about 5E14 atoms/cm$^2$, wherein said extension ion implant forms an extension region on said another side of the patterned gate region, said extension region has a terminal point that is located beneath said extension dielectric spacer and not aligned to an edge of said extension dielectric spacer or an edge of said patterned gate region;
performing a halo ion implant into said semiconductor substrate and on said another side of the patterned gate region of said at least one field effect transistor, said halo ion implant uses an ion dosage of greater than about 1E13 atoms/cm$^2$, said halo ion implant forms a halo implant region on said another side of the patterned gate region, said halo implant region has a terminal point located directly beneath said extension dielectric spacer and not aligned to an edge of said extension dielectric spacer or an edge of said patterned gate region;
removing said mask;
forming a source/drain dielectric spacer onto exposed surfaces of said extension dielectric spacer; and
forming source and drain regions on both sides of said patterned gate region using said source/drain dielectric spacer as an implant mask, wherein said source and drain regions have a terminal point that is located beneath said source/drain dielectric spacer and not aligned to any edge of the source/drain dielectric spacer.

10. The method of claim 9 wherein said halo ion implant comprises a first halo ion implant step using a first halo ion, and a second halo ion implant step using a second halo ion.

11. The method of claim 9 wherein said at least one field effect transistor is an nFET, and said performing said extension ion implant includes selecting an extension dopant ion from Group VA of the Periodic Table of Elements and said performing said halo ion implant includes selecting a halo dopant ion from Group IIIA of the Periodic Table of Elements.

12. The method of claim 9 wherein said performing said extension ion implant includes using an energy from about 5 to about 50 KeV and an implant angle of from 0° to about 30° as measured from a surface of said semiconductor substrate.

13. The method of claim 9 wherein said performing said halo ion implant includes implanting a first halo ion using an energy from about 50 to about 200 KeV and an implant angle of from about 10° to about 30° as measured from a surface of said semiconductor substrate.

14. The method of claim 13 wherein said performing said halo ion implant includes a second halo implant that comprises implanting a second halo ion using an energy from about 5 to about 50 KeV and an implant angle of from about 10° to about 30° as measured from a surface of said semiconductor substrate.

* * * * *